United States Patent [19]

Kawada et al.

[11] Patent Number: 5,041,781

[45] Date of Patent: * Aug. 20, 1991

[54] ASSEMBLY TO BE FITTED IN A CYLINDER OF A PROBE

[75] Inventors: Kazuo Kawada, Murayama; Hiroshi Noguchi, Hamura, both of Japan

[73] Assignee: Stack Electronics Co., Ltd., Tokyo, Japan

[*] Notice: The portion of the term of this patent subsequent to Mar. 19, 2008 has been disclaimed.

[21] Appl. No.: 458,227

[22] Filed: Dec. 28, 1989

[51] Int. Cl.5 .................. G01R 31/02; G01R 1/06
[52] U.S. Cl. ...................... 324/158 P; 324/72.5; 324/158 F; 439/482
[58] Field of Search ............ 324/72.5, 158 P, 158 F, 324/149; 439/482, 824

[56] References Cited

U.S. PATENT DOCUMENTS

| | | | |
|---|---|---|---|
| 2,883,619 | 4/1959 | Kobbe et al. | 324/72.5 |
| 3,826,981 | 7/1974 | Ross | 324/72.5 |
| 4,263,547 | 4/1981 | Johnson | 324/72.5 |
| 4,418,314 | 11/1983 | Nieto, Jr. | 324/72.5 |

Primary Examiner—Kenneth A. Wieder
Assistant Examiner—Vinh P. Nguyen
Attorney, Agent, or Firm—Lackenbach Siegel Marzullo & Aronson

[57] ABSTRACT

An assembly in which a touching needle and a connecting portion are arranged coaxially on a frame spaced from each other, each lead of an electric parts unit is connected to the touching needle or the connecting portion. The assembly is inserted into a probe in form of a cylinder through and end thereof, and the touching needle comes out through the other end thereof, when the assembly is fixed in the cylinder.

2 Claims, 2 Drawing Sheets

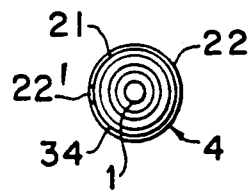
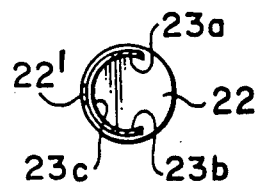
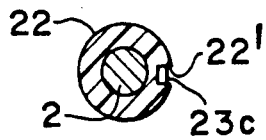
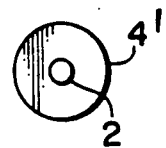
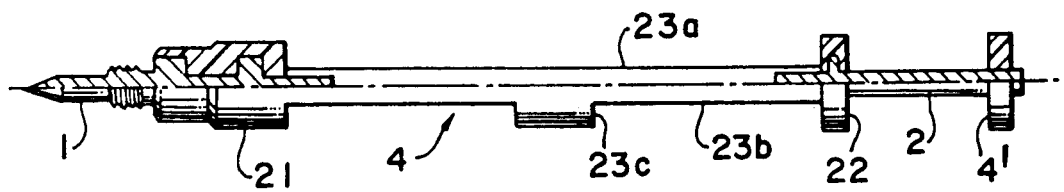
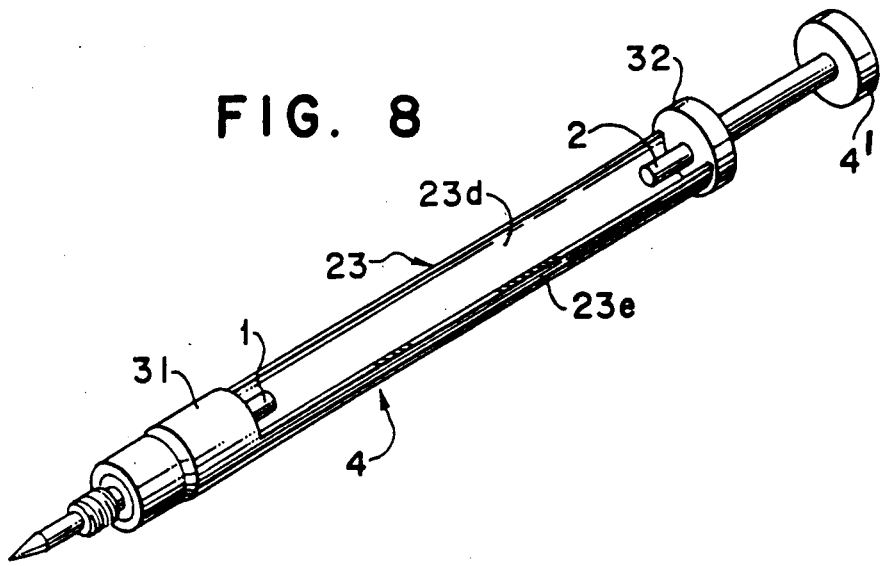

1

ASSEMBLY TO BE FITTED IN A CYLINDER OF A PROBE

BACKGROUND OF THE INVENTION

1. FIELD OF THE INVENTION

The present invention relates to an assembly to be fitted in a cylinder of a probe.

2. Prior Art

A touching needle is installed on an end of a cylinder through the medium of an insulating material. An assembly, which is formed by connecting an electric parts unit with a connecting portion for a coaxial cable, is inserted into the cylinder through the other end thereof.

An inserting end of the assembly is a lead projecting from the electric parts unit, or is a splitted end of a spring member soldered on the lead.

In a probe with a circuit for high and low impedance, a changeover switch is installed on a connecting part for a coaxial cable.

A receiving recess is formed on an inner end of the touching needle. A hole to be used for soldering is formed from the outer side surface of the needle to the receiveing recess. The lead or the spring member is inserted into the receiving recess, and is soldered on the touching needle by pouring solder through the hole.

In order to insert the lead or the spring member into the receiving recess which has a very small diameter, the axial line of the lead or the spring member has to be at one with the axial line of the receiving recess. The lead of the electric parts unit has, however, a very small diameter of about 0.4 mm, so that it is cuurved easily by external forces. Consequently, it is very difficult to care for the electric parts units not to be curved. To make matters worse, the cylinder is of metal and not transparent, so that only a skilled hand can insert the lead or the spring member into the receiving recess for a short time.

It is possible to recognize whether or not the lead is received in the recess only when the hole has a diameter more than 0.8 mm. Even when the hole has a large diameter, it is almost impossible to recognize whether or not soldering is complete by pulling back the assembly, as soldering becomes incomplete or is broken easily even by a weak shearing force, because soldering area is extermely small. Incomplete soldering causes incomplete conductibility.

SUMMARY OF THE INVENTION

An object of this invention is to present an assembly which enables to compose a probe easily without failure. In order to acheive this object, an assembly of this invention comprises a touching needle, a connecting portion for a coaxial cable, a frame on which the touching needle and the connecting portion are fixed coaxially being spaced from each other, and an electric parts unit being connected with the touching needle and the connecting portion.

The touching needle and the connecting portion are preferably fixed on the frame as the frame is being molded. They can however be fixed on the pre-molded frame. An electric parts unit is joined on to the touching needle and the connecting portion by welding, soldering and so on. The electric parts unit is as well-known composed of a condenser(s) and a resistance(s).

The assembly is inserted with the touching needle first into a cylinder through an end thereof. When the tip of the touching needle comes out from the other end of the cylinder, the cylinder is calked to become one body with the touching needle. The cylinder is received in a overcoat as usual. The connecting portion is connected with a coaxial cable.

Another touching needle may be connected with the tip of said touching needle, and these touching needles may be covered by a movable overcoat, which is able to move in relation to said overcoat, and which has a tendency to enclose the touching needles. When the mavable overcoat is pulled down against the tendency thereof, the foremost touching needle can come out from the movable overcoat.

Another object of this invention is to present a frame, which comprises a jointing portion and holding portions at both ends thereof; the holding portions are able to hold a touching needle and a connecting portion on an axial line of a cylinder while the assembly is fitted in the cylinder. To achieve this object, the holding portions are cylindrical so as to fit in the cylinder. As the holding portions fit in the cylinder tightly and coaxially, the touching needle and the connecting portion are kept coaxial with the cylinder.

Another object of this invention is to present a jointing portion of the frame that is light and strong enough. In order to achieve this object, the jointing portion comprises a pair of segments which are parallel with each other and the middle parts of which are joined with each other by an arch segment. An electric parts unit is able to be received between the segments. The leads of the electric parts unit can be soldered with the touching needle and the connecting portion through the space between the lumbers.

Another object of this invention is to provide an assembly and a cylinder with such means as to realize a predetermined length of fit easily and surely. In order to achieve this object, the inner diameter of the part of the cylinder where the holding portion of the frame for the touching needle fits in is narrower than the inner diameter of the part where the holding portion for the connecting portion of the frame fits in, and a step between both parts comes into contact with a step formed between an outer surface of the holding portion of the connecting portion of said frame and the outer surface of the jointing portion, when the assembly fits in the cylinder in a predetermined length of fit.

Another object of this invention is to prevent a jointing portion of a frame which is strong, simple and has an enough space to receive an electric parts unit. In order to achieve this object the jointing portion is of semicylindrical body having a cut-away portion. The electric parts unit can be soldered with the touching needle and the connecting portion through the cut-away portion.

Other objects of this invention will be clear referring to the attached drawings and the description thereof. In the drawings the same numerals indicates the same or corresponding parts.

BRIEF DESCRIPTION OF THE DRAWINGS

FIG. 3 is a left side view of FIG. 2, FIG. 4 is a view sectioned along line 4—4 of FIG. 2, FIG. 5 is a view sectioned along line 5—5 of FIG. 2, FIG. 6 is a right side view of FIG. 2, FIG. 7 is a bottom view of FIG. 2, and FIG. 8 is an isometric view of another embodiment of an assembly according to this invention without an electric parts unit.

DETAILED DESCRIPTION OF THE INVENTION

Figure 1:
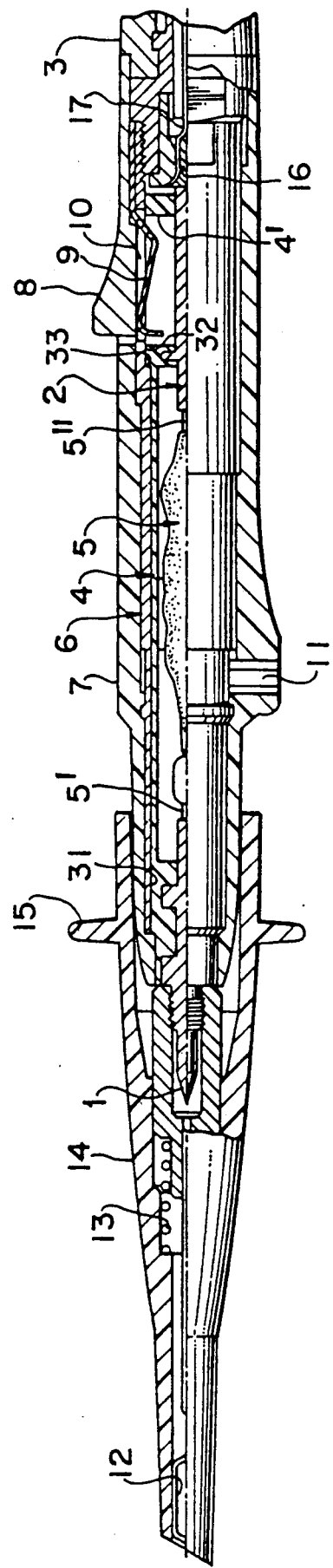
FIG. 1 is partially sectioned side view of a probe comprising an assembly of this invention.

In FIG. 1 an assembly comprises a touching needle 1, a connecting portion 2 with a coaxial cable 3, a frame 4 and an electric parts unit 5. The touching needle 1 and the connecting portion 2 are, being spaced from each other, fixed coaxially on the frame 4.

An electric parts unit 5 has a condenser(s) and a resistance(s) as usual. By welding and so on, an end 5' of the unit 5 is connected with the touching needle 1, and the other end 5" of the unit 5 is connected with the connecting portion 2.

The assembly is inserted into a metal cylinder 6 through an end opening thereof and fixed in the cylinder 6 by calking and so on. An overcoat 7 receives the cylinder 6. An end of a spring 9, which detects zero electrics potential of an oscilloscope, is fixed on the cylinder 6 and the other free end fits on a swingable push button 8 of the overcoat 7. When the push button 8 is pressed into an opening 10, the free end of the spring 9 comes into contact with the connecting portion 2, which is supported by the frame 4 and a ring 4', to compose an earth circuit. An end of an earthclip (not drawn in Figures) is connected with the cylinder 6 through a hole 11. A touching needle 12 is screwed on the touching needle 1 and is covered by a movable overcoat 14, which tends to move away from the overcoat 7 by a spring 13.

An operator brings the touching needle 1 into direct contact with an examinee. If there is the movable overcoat 14, an operator pulls back the overcoat 14 by a handle 15 in the direction of the overcoat 7 to expose the touching needle 12 and bring the needle 12 into contact with an examinee. Signals are sent to the oscilloscope through the touching needle 12 if any, the touching needle 1, the electric parts unit 5, the connecting portion 2, a connecting pin 16 and a central conductor 17.

In FIGS. 2 to 7, the frame 4 comprises a supporting portion 21 for the touching needle 1, a supporting portion 22 for the connecting portion 2 and a jointing portion 23 between the connecting portions 21 and 22. The supporting portions 21, 22 are cylindrical and able to fit well in the cylinder 6, so that the assembly does not move radially. The supporting portion 22 may be provided with a gutter 22' thereon which, by fitting on a projection (not shown in Figures) formed on the inner wall of the cylinder, prevents rotation of the portion 22.

The jointing portion 23 comprises a pair of parallel segments 23a, 23b. An bridge segment 23c bridges over the space between the segments 23a and 23b. Through this space the ends 5', 5" can be welded with the needle 1 or the portion 2. The bridge segment 23c strengthens the jointing portion 23. The electric parts unit 5 can be received between the lumbers 23a and 23b without touching the bridge segment 23c.

Figure 2:
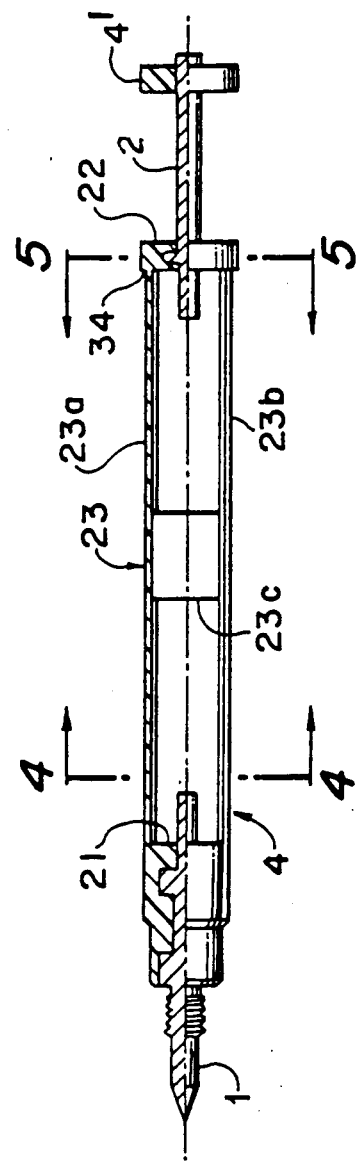
FIG. 2 is a partially sectioned side view of the assembly without the electric parts unit.

In FIGS. 1 to 3, the cylinder 6 comprises a smaller diameter chamber 31, in which the supporting portion 21 fits, and a larger diameter chamber 32, in which the supporting portion 22 fits. There is formed a step 33 between the chambers 31 and 32. There is a step 34 between the supporting portion 22 and the jointing portion 23. The frame 4 is inserted into the cylindder 6 until the step 34 comes into contact with the step 33, when the relative positon of the frame 4 and the cylinder 6 are determined.

In FIG. 8 the jointing portion 23 of the frame 4 is of semi-conductor 23e with a cut-away portion 23d.

Welding operations of the end 5' of the electric parts unit 5 and the touching needle 1 can be done by making use of this cut away portion 23d, and welding operations of the end 5" and the connecting portion 2 as well. The electric parts unit 5 is fixed in the semi-cylinder 23e through these welding operations.

We claim:

1. An assembly to be fitted into a hollow cylindrical member of a probe, said assembly comprising:
    a longitudinally extending hollow frame having a first cylindrically shaped support member coaxial with the longitudinal axis of said frame, a second cylindrically shaped support member coaxial with the longitudinal axis of said frame and being spaced from said first support member, and a cylindrical joining member comprising a pair of spaced apart parallel segments which are joined by a bridging segment, said joining member being coaxial with the longitudinal axis of said frame and joining said first and second support members;
    a touching needle supported at one end of said frame by the first support member and being in axial alignment with the longitudinal axis of said frame;
    a connecting element supported on said frame by the second support member and being in axial alignment with the longitudinal axis of said frame and spaced from said touching needle; and
    an electric parts unit positioned between said touching needle and said connecting element within said at least partly cylindrical hollow-frame having two opposite end terminals which are both in axial alignment with the longitudinal axis of said frame and respectively connected to the adjacent touching needle and connecting element.

2. An assembly in accordance with claim 1 wherein the diameter of the first support member is less than the diameter of the second support member so that said second support member forms a stop for predeterminately limiting the extent to which the assembly can be fitted into said probe.

* * * * *